United States Patent
Whitby-Strevens

(10) Patent No.: US 9,307,266 B2
(45) Date of Patent: *Apr. 5, 2016

(54) METHODS AND APPARATUS FOR CONTEXT BASED LINE CODING

(71) Applicant: APPLE INC., Cupertino, CA (US)

(72) Inventor: Colin Whitby-Strevens, Ben Lomond, CA (US)

(73) Assignee: APPLE INC., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/579,855

(22) Filed: Dec. 22, 2014

(65) Prior Publication Data

US 2015/0181238 A1 Jun. 25, 2015

Related U.S. Application Data

(63) Continuation of application No. 13/842,500, filed on Mar. 15, 2013, now Pat. No. 8,917,194.

(51) Int. Cl.
*H03M 7/00* (2006.01)
*H04N 19/65* (2014.01)
(Continued)

(52) U.S. Cl.
CPC ............... *H04N 19/65* (2014.11); *H03M 5/145* (2013.01); *H04N 19/46* (2014.11); *H03M 13/31* (2013.01); *H03M 13/35* (2013.01)

(58) Field of Classification Search
CPC .. H03M 1/0641; H03M 5/14; H04N 21/4367; H04L 25/49; H04L 25/4908; H04L 25/4915; H04L 12/5692; H04L 1/006; H04L 1/0084; H04L 1/203; H04L 1/00; H04L 1/0007; H04L 29/06; H04L 27/2602; H04L 27/2608; G09G 5/006; G09G 2370/12; G11B 20/1426; G06F 2203/04107

USPC ............... 341/50, 51, 56, 58, 68; 375/240.01, 375/292, 342, 296, 341; 725/20, 131; 714/759, 777; 398/79, 155

See application file for complete search history.

(56) References Cited

U.S. PATENT DOCUMENTS

| 3,902,117 A | 8/1975 | Sheppard |
| 4,523,181 A * | 6/1985 | Tazaki ............... G11B 20/1426 341/58 |

(Continued)

FOREIGN PATENT DOCUMENTS

| CN | 101573873 A | 11/2009 |
| CN | 102290024 A | 12/2011 |

(Continued)

OTHER PUBLICATIONS

IEEE Standard for a High-Performance Serial Bus, IEEE Computer Society, Oct. 21, 2008.

(Continued)

*Primary Examiner* — Lam T Mai
(74) *Attorney, Agent, or Firm* — Gazdzinski & Associates, PC

(57) ABSTRACT

Methods and apparatus intelligently switching between line coding schemes based on context. In one exemplary embodiment, an High Definition Multimedia Interface (HDMI) system is configured to transmit control and video data according to an 8B/10B line coding protocol, and data island data according to TERC4 (TMDS (Transition Minimized Differential Signaling) Error Reduction Coding 4-bit). Various elements of the disclosed HDMI devices are configured to determine when a context switch occurs, and thereafter seamlessly transition between the appropriate line code protocol.

19 Claims, 3 Drawing Sheets

(51) Int. Cl.
*H03M 5/14* (2006.01)
*H04N 19/46* (2014.01)
*H03M 13/31* (2006.01)
*H03M 13/35* (2006.01)

(56) References Cited

U.S. PATENT DOCUMENTS

| | | | |
|---|---|---|---|
| 4,791,407 A * | 12/1988 | Prucnal | H03M 5/14 341/68 |
| 5,224,096 A | 6/1993 | Onishi et al. | |
| 5,461,426 A | 10/1995 | Limberg et al. | |
| 5,961,680 A * | 10/1999 | Wooldridge | C03B 7/16 65/225 |
| 6,381,332 B1 | 4/2002 | Glaab | |
| 6,426,780 B1 | 7/2002 | Limberg et al. | |
| 6,574,731 B1 | 6/2003 | Coles et al. | |
| 6,618,395 B1 | 9/2003 | Kimmitt | |
| 6,870,930 B1 | 3/2005 | Kim et al. | |
| 7,062,587 B2 | 6/2006 | Zaidi et al. | |
| 7,062,687 B1 | 6/2006 | Gfeller et al. | |
| 7,062,689 B2 | 6/2006 | Slobodnik | |
| 7,257,163 B2 | 8/2007 | Hwang et al. | |
| 7,359,437 B2 | 4/2008 | Hwang et al. | |
| 7,365,575 B2 * | 4/2008 | Kim | G06F 1/04 326/95 |
| 7,394,406 B2 * | 7/2008 | Pasqualino | H04L 1/0084 341/50 |
| 7,403,486 B2 | 7/2008 | Flask | |
| 7,460,031 B2 * | 12/2008 | Yeo | G09G 5/006 341/50 |
| 7,561,074 B2 * | 7/2009 | Pasqualino | H04L 1/0084 341/50 |
| 7,573,596 B2 | 8/2009 | Owen | |
| 7,639,687 B1 | 12/2009 | Tsai et al. | |
| 7,672,285 B2 | 3/2010 | Sun et al. | |
| 7,773,752 B2 | 8/2010 | Noh et al. | |
| 7,961,880 B2 | 6/2011 | Wang et al. | |
| 8,000,404 B2 | 8/2011 | Talbot et al. | |
| 8,139,660 B2 | 3/2012 | Anigstein et al. | |
| 8,253,605 B2 * | 8/2012 | Rivoir | H03M 1/0641 341/110 |
| 8,325,699 B2 | 12/2012 | Sun et al. | |
| 8,588,287 B2 | 11/2013 | Chen et al. | |
| 8,644,504 B2 * | 2/2014 | Choi | G09G 5/006 380/210 |
| 8,650,010 B2 | 2/2014 | M et al. | |
| 8,678,860 B2 * | 3/2014 | Minich | H01R 24/30 439/607.05 |
| 8,737,625 B2 | 5/2014 | Ikeda et al. | |
| 8,750,176 B2 | 6/2014 | Whitby-Strevens | |
| 8,838,822 B2 | 9/2014 | Spalla et al. | |
| 8,917,194 B2 * | 12/2014 | Whitby-Strevens | 341/50 |
| 8,949,493 B1 | 2/2015 | Wortman et al. | |
| 2002/0051562 A1 | 5/2002 | Sheppard et al. | |
| 2002/0138721 A1 | 9/2002 | Kwon et al. | |
| 2003/0005436 A1 | 1/2003 | Naganuma | |
| 2003/0043141 A1 | 3/2003 | Bae et al. | |
| 2003/0048851 A1 | 3/2003 | Hwang et al. | |
| 2003/0048852 A1 | 3/2003 | Hwang et al. | |
| 2003/0214507 A1 | 11/2003 | Mawatari et al. | |
| 2004/0088633 A1 | 5/2004 | Lida et al. | |
| 2004/0103363 A1 | 5/2004 | Kim et al. | |
| 2004/0131025 A1 | 7/2004 | Dohler et al. | |
| 2005/0012592 A1 | 1/2005 | Debelleix | |
| 2005/0185796 A1 | 8/2005 | Lablans | |
| 2005/0286643 A1 | 12/2005 | Ozawa et al. | |
| 2006/0095613 A1 | 5/2006 | Venkata et al. | |
| 2006/0117125 A1 | 6/2006 | Tseng | |
| 2006/0250628 A1 | 11/2006 | Owen | |
| 2007/0016778 A1 | 1/2007 | Lyle | |
| 2007/0016779 A1 | 1/2007 | Lyle | |
| 2007/0074242 A1 | 3/2007 | Wang et al. | |
| 2007/0107034 A1 | 5/2007 | Gotwals | |
| 2007/0116055 A1 | 5/2007 | Atsumi et al. | |
| 2007/0139232 A1 | 6/2007 | Venkata et al. | |
| 2007/0192664 A1 | 8/2007 | Ogawa et al. | |
| 2007/0204204 A1 | 8/2007 | Sul et al. | |
| 2007/0206638 A1 | 9/2007 | Santoru et al. | |
| 2007/0206642 A1 | 9/2007 | Egan et al. | |
| 2007/0220279 A1 | 9/2007 | Northcutt et al. | |
| 2007/0230687 A1 | 10/2007 | Talbot et al. | |
| 2007/0237332 A1 | 10/2007 | Lyle | |
| 2007/0242764 A1 | 10/2007 | Anigstein et al. | |
| 2007/0257923 A1 | 11/2007 | Whitby-Strevens | |
| 2008/0024334 A1 | 1/2008 | Grivna | |
| 2008/0046728 A1 | 2/2008 | Lyle | |
| 2008/0095218 A1 | 4/2008 | Murray et al. | |
| 2008/0180287 A1 | 7/2008 | Widmer | |
| 2008/0204285 A1 | 8/2008 | Carter et al. | |
| 2008/0235551 A1 | 9/2008 | Lin | |
| 2008/0252497 A1 | 10/2008 | Widmer | |
| 2008/0258945 A1 | 10/2008 | Widmer | |
| 2008/0263621 A1 | 10/2008 | Austerlitz et al. | |
| 2008/0273602 A1 | 11/2008 | Glen et al. | |
| 2008/0304596 A1 | 12/2008 | Tan et al. | |
| 2009/0010318 A1 | 1/2009 | Belogolovyi et al. | |
| 2009/0024756 A1 | 1/2009 | Spalla et al. | |
| 2009/0147864 A1 | 6/2009 | Lida et al. | |
| 2009/0185565 A1 | 7/2009 | Diab et al. | |
| 2010/0057556 A1 | 3/2010 | Rousso et al. | |
| 2010/0067693 A1 | 3/2010 | Courington et al. | |
| 2010/0074350 A1 | 3/2010 | Malladi et al. | |
| 2010/0118795 A1 | 5/2010 | Hassan | |
| 2010/0128816 A1 | 5/2010 | Sun et al. | |
| 2010/0238951 A1 | 9/2010 | Ozawa | |
| 2010/0262893 A1 | 10/2010 | Carter et al. | |
| 2010/0322340 A1 | 12/2010 | Bohm | |
| 2011/0122142 A1 | 5/2011 | Wyatt et al. | |
| 2011/0208954 A1 | 8/2011 | Barrett et al. | |
| 2011/0246840 A1 | 10/2011 | Khoshnevis et al. | |
| 2011/0310296 A1 | 12/2011 | Lee et al. | |
| 2011/0320905 A1 | 12/2011 | Lin et al. | |
| 2012/0084559 A1 | 4/2012 | Bonicatto | |
| 2012/0087973 A1 | 4/2012 | Lieberman et al. | |
| 2012/0139593 A1 | 6/2012 | Saito et al. | |
| 2012/0146989 A1 | 6/2012 | Whitby-Strevens | |
| 2012/0163490 A1 | 6/2012 | Whitby-Strevens | |
| 2012/0188951 A1 | 7/2012 | He et al. | |
| 2013/0195160 A1 | 8/2013 | Whitby-Strevens | |
| 2013/0195218 A1 | 8/2013 | Whitby-Strevens | |
| 2014/0344650 A1 | 11/2014 | Au | |

FOREIGN PATENT DOCUMENTS

| | | |
|---|---|---|
| EP | 1517295 A2 | 3/2005 |
| EP | 1940034 A1 | 7/2008 |
| EP | 2490473 A1 | 8/2012 |
| WO | WO-03058826 A2 | 7/2003 |
| WO | WO-2011044793 A1 | 4/2011 |
| WO | WO-2012087973 A1 | 6/2012 |
| WO | WO-2013112930 A2 | 8/2013 |

OTHER PUBLICATIONS

Nxp: "Technical Analysis of the JEDEC JESD204A Data Converter Interface", Jun. 1, 2009, XP055070699, Retrieved from Internet: URL:http://www.nxp.com/wcmadocuments/newsklownload-media/publications/technical_whitepaper final.pdf [retrieved on Jul. 10, 2013) section 3.2 last but one par. p. 12 2nd par. p. 3; figure 4.
Stein, Digital Signal Processing, a Computer Science Perspective, 2000, John Wiley & Sons Inc., pp. 712-713.
Video Electronics Standards Association: "Displayport Standard Version 1.1", Mar. 19, 2007, pp. 1-228.
Widmer, A. X., Franaszek, PA., "A DC/Balanced, Partitioned/Block, 8B/10B Transmission Code", IBM "I_Res. Develop, vol. 27, No. 5, Sep. 1983, pp. 440/451.

* cited by examiner

METHODS AND APPARATUS FOR CONTEXT BASED LINE CODING

PRIORITY AND RELATED APPLICATIONS

This application is a continuation of and claims priority to co-owned and co-pending U.S. patent application Ser. No. 13/842,500 filed Mar. 15, 2013, entitled "METHODS AND APPARATUS FOR CONTEXT BASED LINE CODING", which is incorporated herein by reference in its entirety.

This application is also related to co-owned, co-pending U.S. patent application Ser. No. 13/747,264 filed on Jan. 22, 2013 and entitled "METHODS AND APPARATUS FOR THE INTELLIGENT SCRAMBLING OF CONTROL SYMBOLS", Ser. No. 13/747,383 filed Jan. 22, 2013 and entitled "METHODS AND APPARATUS FOR ERROR RATE ESTIMATION", and Ser. No. 12/976,274 filed Dec. 22, 2010 and entitled "METHODS AND APPARATUS FOR THE INTELLIGENT ASSOCIATION OF CONTROL SYMBOLS", each of the foregoing being incorporated herein by reference in its entirety.

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND

1. Technical Field

The present disclosure relates generally to the field of data networking and telecommunications. More particularly, in one exemplary aspect, the present disclosure is directed to context based line coding.

2. Description of Related Technology

High-Definition Multimedia Interface (HDMI) is an exemplary digital display interface standard for connecting multimedia data sources to multimedia display devices. Existing HDMI devices generally support video data, audio data, control data, and optionally network connections. Historically, HDMI was developed to improve audio visual (A/V) interface capabilities while still supporting legacy interfaces (e.g., Digital Visual Interface (DVI)). However, legacy signaling standards were designed around assumptions that are no longer accurate for many consumer electronics. Specifically, aggressive device form factors (e.g., those which are very spatially compact, contain metal casings or other components, etc.) may experience link reliability issues which were heretofore unknown.

For example, HDMI uses Transition Minimized Differential Signaling (TMDS) to reduce electromagnetic interference (EMI), and assist in accurate clock recovery. TMDS maps eight (8) bit data to ten (10) bit symbols. The mapping reduces the likelihood of overshooting or undershooting signaling transitions which can contribute to bit errors. Additionally, TMDS ensures that the data has regular transitions, which is required for clock-data recovery. The mapping scheme of TMDS is simple enough to be handled entirely in link layer hardware i.e., without the assistance of higher layer software.

While TMDS could be considered a form of 8B/10B encoding, it is appreciated that as used within the relevant arts, the term "8B/10B" refers to a specific protocol developed by IBM (the IBM 8B/10B scheme was subject to patents which have since expired). According to the IBM 8B/10B scheme (as described within "*A DC Balanced, Partitioned-Block, 8B/10B Transmission Code*" to Widmer and Franaszek, incorporated herein by reference in its entirety), the five (5) least significant bits (LSB) of data are encoded into a six (6) bit group (the 5b/6b portion) and the three (3) most significant bits (MSB) are encoded into a 4-bit group (the 3b/4b portion). These code groups are concatenated together to form a 10-bit symbol. For clarity, as used hereinafter, the term "8B/10B" refers to the common usage (i.e., the IBM 8B/10B variant).

Due to certain business considerations, future versions of HDMI may substitute the existing TMDS scheme with the more common 8B/10B scheme. Unfortunately, in under certain conditions TMDS provides significant benefits and/or redundancies which 8B/10B does not provide. Accordingly, improved methods and apparatus for combining the benefits of 8B/10B and TMDS are needed. More generally, solutions are needed to select from various forms of line coding according to a contextual consideration.

SUMMARY

A method for intelligently switching between line coding schemes based on context is disclosed. In one embodiment, the method includes: receiving one or more symbols according to a first context, at a receiving apparatus, the first context characterized by a first line coding scheme; detecting, by the receiving apparatus, when a context switch to a second context will occur based on one or more media parameters; and when the context switch occurs, changing, by the receiving apparatus, to the second context.

In one variant, the context switch occurs when preamble symbol is received during a blanking interval configured in accordance with the one or more media parameters.

In another variant, the first context is associated with a first state, and the second context is associated with a second state. In some cases, the first context comprises an 8B/10B line coding context and the first state is an active video state or blanking state. In other cases, the second context comprises a TMDS (Transition Minimized Differential Signaling) Error Reduction Coding 4-bit (TERC4) line coding context and the second state is a data island state. In still other cases, transitioning between the first state and the second state is based at least in part on receiving a preamble during a blanking interval, where the blanking interval is determined from the one or more media parameters.

In a third variant, a blanking interval is determined at least in part by the one or more media parameters. In some cases, the one or more media parameters additionally includes at least one or more of a fixed number of scan lines and a length of each scan line.

An apparatus configured to intelligently switch between line coding schemes based on context is disclosed. In one embodiment, the apparatus includes: a first interface configured to receive one or more symbols according to at least one of: (i) a first context, the first context characterized by a first line coding scheme, and (ii) a second context, the second context characterized by a second line coding scheme; a processor coupled to the first interface; and a non-transitory computer-readable medium comprising one or more instructions. In one exemplary embodiment, the one or more instructions are configured to cause the processor to: detect when the context switch will occur based on one or more media parameters and a current state of a state machine; and when a context switch occurs, change context.

In one variant, the state machine comprises an active video state, a blanking state, and a data island state. In one such case, the state machine is configured to transition between the active video state and the blanking state based on one or more preamble symbols. In another implementation, the blanking state is based on the one or more media parameters. In other cases, the one or more media parameters comprise one or more attributes selected from the group consisting of: a display size, a frame rate, and a blanking interval length. In some such variants, the context switch occurs when a preamble symbol is received during a blanking interval configured in accordance with the one or more media parameters.

Another apparatus configured to intelligently switch between line coding schemes based on context is disclosed. In one embodiment, the apparatus includes: a sink configured to receive one or more symbols according to at least one of: (i) a first context, the first context characterized by a first line coding scheme, and (ii) a second context, the second context characterized by a second line coding scheme; a source configured to transmit the one or more symbols according to the first and second contexts; a display element; a processor; and a non-transitory computer-readable medium comprising one or more instructions. In one exemplary embodiment, the one or more instructions, when executed by the processor, are configured to cause the apparatus to: determine when a context switch should occur based on one or more media parameters and a current state of a state machine; and when a context switch occurs, cause the source to change the context.

In one variant, the one or more media parameters are associated with a media file stored within the non-transitory computer-readable medium. In one such variant, the one or more media parameters are based at least in part on a display size, a frame rate, and a blanking interval length associated with the display element.

In other variants, the first context comprises an 8B/10B line coding context and the first state is an active video state or blanking state. In still other variants, the second context comprises a TMDS (Transition Minimized Differential Signaling) Error Reduction Coding 4-bit (TERC4) line coding context and the second state is a data island state.

Other features and advantages of the present disclosure will immediately be recognized by persons of ordinary skill in the art with reference to the attached drawings and detailed description of exemplary embodiments as given below.

All Figures © Copyright 2013 Apple Inc. All rights reserved.

DETAILED DESCRIPTION

Reference is now made to the drawings, wherein like numerals refer to like parts throughout.

Detailed Description of Exemplary Embodiments

Exemplary embodiments of the present disclosure are now described in detail. While these embodiments are primarily discussed in the context of High-Definition Multimedia Interface (HDMI) link or interface operation, it will be recognized by those of ordinary skill given this disclosure that the present embodiments are not so limited. In fact, the various principles described herein are useful in and readily adapted to any data bus interface that can benefit from context based line coding, as described herein.

As used hereinafter, the term "line code" and "line coding" refers to a scheme for representing a digital signal to be transported by an analog signal over a transmission line. Common examples of line codes include, without limitation: Hamming codes, 8B/10B, 64B/66B, 128B/130B, RZ (return to zero), NRZ (non-return to zero), NRZI (non-return to zero, inverted), Manchester code, Eight to Fourteen Modulation (EFM), TERC4, etc.

Figure 1:
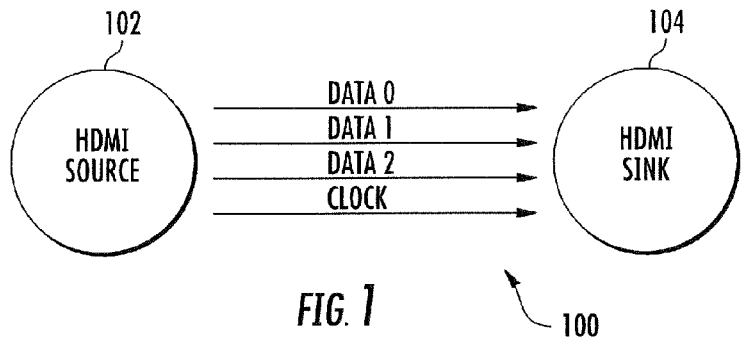
FIG. 1 is a graphical representation of one exemplary multimedia system, useful in conjunction with the present disclosure.

Referring now to FIG. 1, one exemplary multimedia system is illustrated. As shown the system 100 includes one or more multimedia sources 102, and one or more multimedia sinks 104. Common examples of multimedia sources include, without limitation, media players (e.g., Digital Video Disk (DVD) players, Blue-ray players, etc.), content delivery networks, audio/visual (A/V) equipment (e.g., camcorders, etc.), personal computers (PC), etc. Common examples of multimedia sinks include, without limitation, media displays, televisions, monitors, etc.

In one exemplary embodiment of the present disclosure, the multimedia system comprises a High-Definition Multimedia Interface (HDMI) compliant source and sink. The exemplary HDMI interface comprises four (4) differential signaling pairs that consist of: three (3) data channels (data channel 0, data channel 1, data channel 2), and a clock (characterized by a 1/10 bit-rate frequency). In other configurations (such as e.g., future implementations of HDMI), the clock differential pair may be replaced with another data channel.

Figure 2:
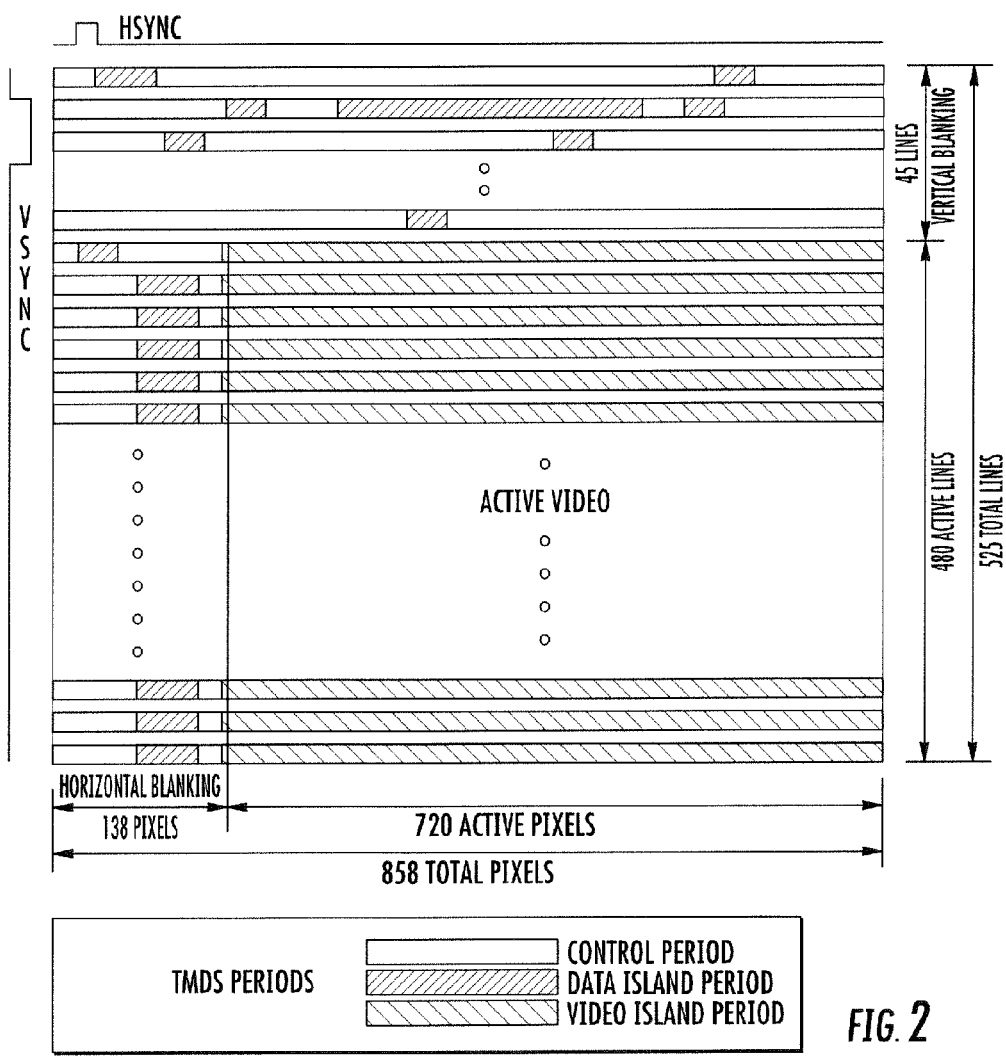
FIG. 2 is a graphical representation of the data traffic that constitutes a frame of 720×480 pixels of video data, useful in conjunction with the present disclosure.

FIG. 2 is a graphical representation of exemplary data traffic representing a frame of 720×480 pixels of video data. It should be noted that the foregoing resolution is merely illustrative of a common video frame size, those of ordinary skill in the related arts will appreciate that other video frame sizes may be substituted. As a brief aside, the current incarnation of HDMI specifies five (5) different types of information: (i) control information, (ii) preamble, (iii) guard band, (iv) data island data and (v) video data. As shown in FIG. 2, the first 45 scan lines constitute the vertical blanking interval. Thereafter, the first 138 pixels of each scan line is a horizontal blanking interval, the remaining 720 pixels is video data. During both the horizontal and vertical blanking intervals, the data channels may transmit either control data or data islands. The preamble and guard band information are provided to facilitate identification of data islands and/or video data. A preamble immediately precedes data island periods and video data periods. Both video data periods and data island periods start with a guard band. Data island periods may also conclude with a guard band.

As a brief aside, prior art HDMI TMDS observes a fixed set of rules that enables only a subset of possible symbols, based on the type of data. Moreover, for simplicity, only 10-bit patterns are used to represent the information to be transmitted (i.e., the symbols do not change in length). Specifically, the 10-bit encodings used for control and preamble transmissions share common symbols which are disjoint from (i.e., do not overlap) the 10-bit symbols used for the other types of data (guard band, data island and video data). Similarly, the 10-bit symbol encodings used for data island transmissions (also referred to as TERC4 (TMDS Error Reduction Coding 4-bit) encoding) are distinct. The 10-bit symbols used for the guard band are a subset of the symbol encodings used for video data.

Unfortunately, existing TMDS encoding does not provide redundant information (unlike forward error correction (FEC) codes e.g., hamming codes, parity codes, Viterbi codes, turbo codes, etc.). Other line codes (such as IBM 8B/10B) determine bit errors by examining a running disparity. A running disparity is a value that is based on a running count of ones (voltage high) and zeros (voltage low). For example, 8B/10B ensures that the difference between the number of ones transmitted and the number of zeros transmitted is bounded to no more than one (+1 or −1) at the end of each symbol. By keeping a very tight control on running disparity, 8B/10B can identify bit errors immediately (if the running disparity is different between the transmitter and receiver, then a bit error has occurred). With TMDS encoding, the running disparity can be up to a difference of eight (8) at character (symbol) boundaries; thus, many single-bit errors can occur without detection in TMDS.

Moreover, if a 10-bit TMDS symbol has a single corrupted bit, the de-mapped 8-bit data may have different levels of corruption (i.e., a single-bit error in the symbol may map into multiple bit errors in the data). Since the de-mapping of 10-bit symbols to 8-bit data is being performed transparently to higher layer software, higher layer correction schemes cannot resolve this deficiency.

While HDMI uses TMDS encoding for data, HDMI uses the so-called TERC4 line code for data islands. TERC4 encoding encodes four (4) bits of data within a ten (10) bit symbol. Due to the high levels of bit redundancy, TERC4 encoding is quite robust. TERC4 encoding also provides e.g., +0 disparity (i.e., all codes contain the same number of ones (1) and zeros (0)), limited run-length (run-length is the number of consecutive ones (1), or alternately zeros (0)), etc.

To these ends, rather than replacing all TMDS encoding with 8B/10B encoding, exemplary embodiments of the present disclosure switch between 8B/10B encoding under certain contexts (e.g., control data, video data, etc.), and TERC4 encoding for other contexts (e.g., data islands).

In some implementations, existing HDMI mechanisms for switching between TMDS and TERC4 can be modified to transition between 8B/10B and TERC4. However, as previously noted, prior art HDMI TMDS observes a fixed set of rules that enables only a subset of possible symbols based on the type of data; these rules do not explicitly exist for 8B/10B. Consequently, various embodiments of the present disclosure are further configured to intelligently switch between encoding schemes according to the appropriate context.

Unlike TMDS, 8B/10B is based on a very tightly controlled running disparity for 8B/10B (i.e., 8B/10B ensures that the difference between the number of ones transmitted and the number of zeros transmitted is bounded to no more than one (+1 or −1) at the end of each symbol), accordingly the 8B/10B receiver can always identify isolated single bit errors. Such an error often converts a valid symbol into an invalid symbol, in which case the presence of an error is immediately identifiable. In all cases, a single bit error will cause the receiver's notion of the current running disparity to differ from that of the transmitter. After some number of symbols, the situation will arise where either the running disparity exceeded +/−1, and/or the currently received symbol is not valid, considering the receiver's notion of the current running disparity. Either of these can be used to infer that an error has occurred. Since 8B/10B symbols can be decoded with much higher accuracy, the receiver can rely on explicit signaling between the receiver and transmitter entities (as opposed to TMDS which relies on the symbol type to determine the type of data being transmitted).

Methods

Figure 3:
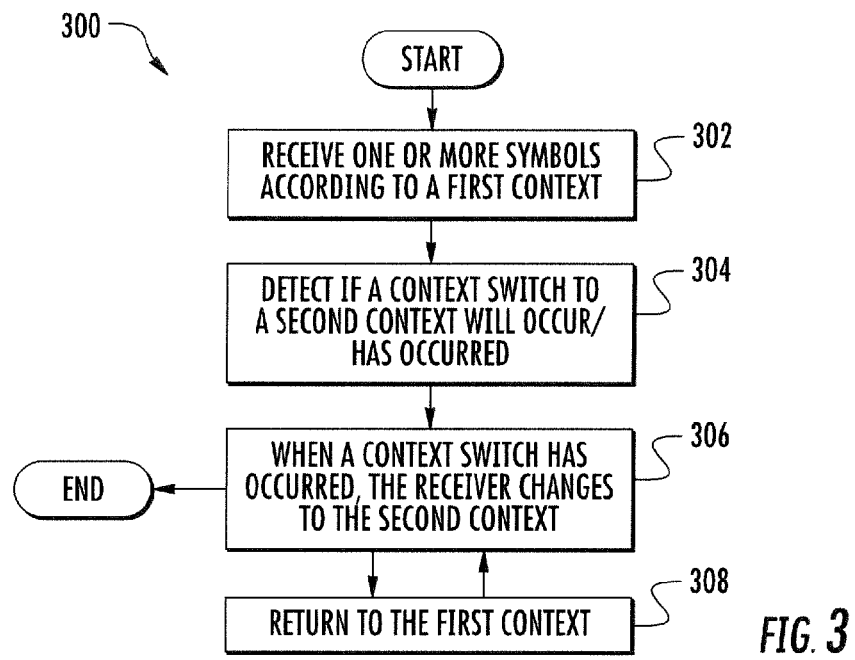
FIG. 3 is a logical flow diagram that illustrates one embodiment of a generalized method for intelligently switching between line coding schemes based on context, in accordance with the present disclosure.

FIG. 3 illustrates one embodiment of a generalized method 300 for intelligently switching between line coding schemes based on context.

At step 302 of the method 300, the receiver receives one or more symbols according to a first context. The symbols constitute a media stream for an audio/visual (AV) type application. Common examples of AV applications include e.g., streaming video, streaming audio, streaming data, etc. In one exemplary embodiment, the AV stream is HDMI data that is separated into two (2) distinct contexts. In one exemplary embodiment, the first context is for HDMI control or video data periods that are encoded according to an 8B/10B protocol, and the second context is for HDMI data island period that are encoded according to a TERC4 protocol. It is further appreciated that while the present disclosure is directed to two (2) contexts, any number of additional contexts can be used e.g., three (3), four (4), etc.

While the foregoing examples are primarily discussed with respect to a unidirectional media stream from a "transmitter" to a "receiver", it is appreciated that other technologies may utilize bi-directional communication and/or incorporate transmitter and receiver functions within a common transceiver device. Additionally, other technologies may support more complex topologies e.g., many to one, one to many, dynamic routing (e.g., packet switched networking), etc.

In certain embodiments, the one or more symbols may further incorporate various error correction capabilities, and/or protocol requirements. Common examples of error correction schemes include, without limitation: forward error correction (FEC), parity bits, hamming (redundancy) bits, cyclic redundancy check (CRC) bits, etc. Common examples of protocol requirements include e.g., minimum and/or maximum run lengths, minimum and/or maximum running disparities (e.g., a count of a running difference of ones and zeros), even disparity (e.g., even number of ones and zeros), format requirements, minimum and/or maximum sizes (e.g., of symbols, packets, etc.), etc.

In some embodiments, the media stream may rely on various other types of out-of-band signaling (e.g., clocks, resets, enables, blanking signals, etc.).

At step 304 of the method 300, the receiver detects if a context switch to a second context will occur/has occurred, based on the received one or more symbols and/or media parameters.

In alternate embodiments, the transmitter may need to respond to changes in context issued by the receiver. For example, the receiver may change its display size according to user preference/activity (which may result in the transmitter adjusting one or more media parameters, etc.), etc. In still other embodiments, the context may be jointly determined/ negotiated between the transmitter and the receiver. For instance, networked embodiments may be required to throttle down (or throttle up) media streams according to other network priorities, etc.

In one embodiment, the received one or more symbols may be specifically configured to convey a context switch. For example, in one such case a data island preamble indicates that a data island context is to be initiated.

In other cases, the context switch may be based on one or more media parameters. For example, in certain embodiments, the transmitter and receiver have agreed on one or more attributes of the media stream (e.g., display size, frame rate, blanking interval length, etc.). Accordingly, based on the one or more attributes of the media stream, the receiver may deduce an appropriate context. For example, given a specified frame rate, and display size, a receiver can determine the appropriate scan line size, and/or blanking intervals. Data islands that occur within the blanking intervals can trigger a context switch.

At step 306 of the method 300, when a context switch has occurred, the receiver changes to the second context. Thereafter, the receiver can return the interface to the original first context when the second context has concluded (step 308). Various return events can be based on e.g., subsequently received symbols and/or media parameters.

Example Operation

In one exemplary embodiment, an exemplary HDMI transmitter provides an HDMI data stream to an exemplary HDMI receiver. The HDMI stream can up to five (5) different types of information: (i) control information, (ii) preamble, (iii) guard band, (iv) data island data and (v) video data. Of the different types of information, only the data island data is configured for transmission with TERC4 line coding, the remaining types or data are transmitted with 8B10B encoding.

According to HDMI protocols, during both the horizontal and vertical blanking intervals, the data channels may transmit either control data or data islands. The preamble and guard band information are provided to facilitate identification of data islands and/or video data. A preamble immediately precedes data island periods and video data periods. Both video data periods and data island periods start with a guard band. Data island periods may also conclude with a guard band. While a preamble is used to identify both data islands and video data, it is appreciated that data island data is only transmitted during blanking periods, whereas video data is only transmitted during the active video periods (see e.g., FIG. 2).

Figure 4A:
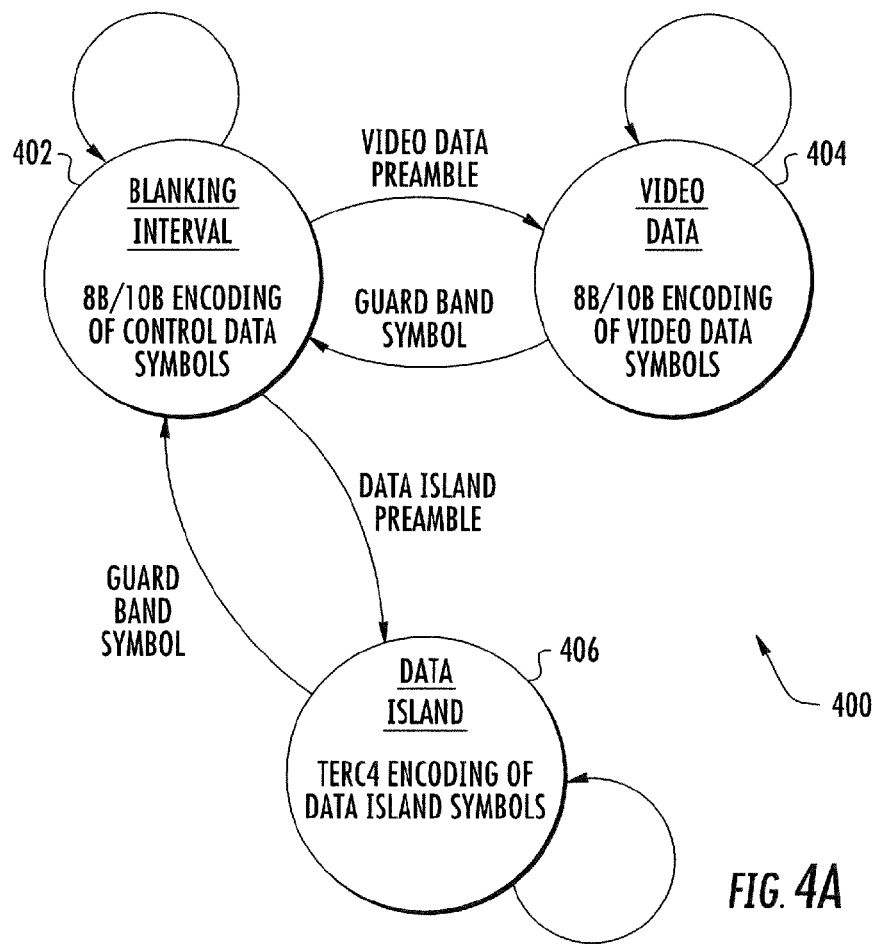
FIG. 4A is a graphical representation of one exemplary state machine configured to transition between 8B/10B line coding and TERC4 line coding schemes based on HDMI data context, according to the present disclosure.

Within the foregoing context, FIG. 4A illustrates one exemplary state machine 400 configured to transition between 8B/10B line coding and TERC4 line coding schemes based on HDMI data context. The finite state machine 400 is implemented as a complementary set of state machines in both the transmitter and the receiver (i.e., the transmitter and the receiver each maintain a distinct state machine, operating synchronously with its peer counterpart). As shown the state machine comprises three (3) states: a blanking state 402, an active video state 404, and a data island state 406. During the blanking and active video states (402, 404), the HDMI transmitter and receiver operate with 8B/10B encoding. During the data island state 406, the HDMI transmitter and receiver operate with TERC4 encoding.

The transitions between the states are demarcated by the transmitter with existing HDMI preamble and/or guard band signaling, dimension information (e.g., a 720×480 display has a fixed number of scan lines (480) and length of each scan line (720)), and frame rate (e.g., vertical blanking intervals and horizontal blanking intervals must end in time for the next "frame"). More generally, it is appreciated that context switching can be determined and/or assisted with media parameters.

Furthermore, it is appreciated that certain practical limitations on software and hardware may dictate implementation requirements. For example, while video media parameters may be determined by application software/driver software, it is appreciated that the speed constraints of software execution may not be sufficient to implement the context switch. However, low level hardware can be primed for transitions, where the transition is actually triggered by preamble and/or guard band symbols. Accordingly, the preamble and/or guard band data can be used with video media parameters to effect timely context switches.

For example, in the blanking state 402, when a video type preamble is received at the conclusion of the blanking interval (e.g., the vertical blanking interval, or the horizontal blanking interval), the state machine transitions to an active video state 404. After the video data has been sent (as indicated by a guard band and/or blanking interval signaling), the state machine transitions back to the blanking state 402.

However, if a data island preamble is received in the blanking state 402 before the blanking interval has ended, the state machine transitions to a data island state 406. In the data island state 406, the transmitter and receiver transact data according to TERC4 protocols. While in the data island state 406, a concluding guard band symbol is used to trigger the return to the blanking state 404.

Figure 4B:
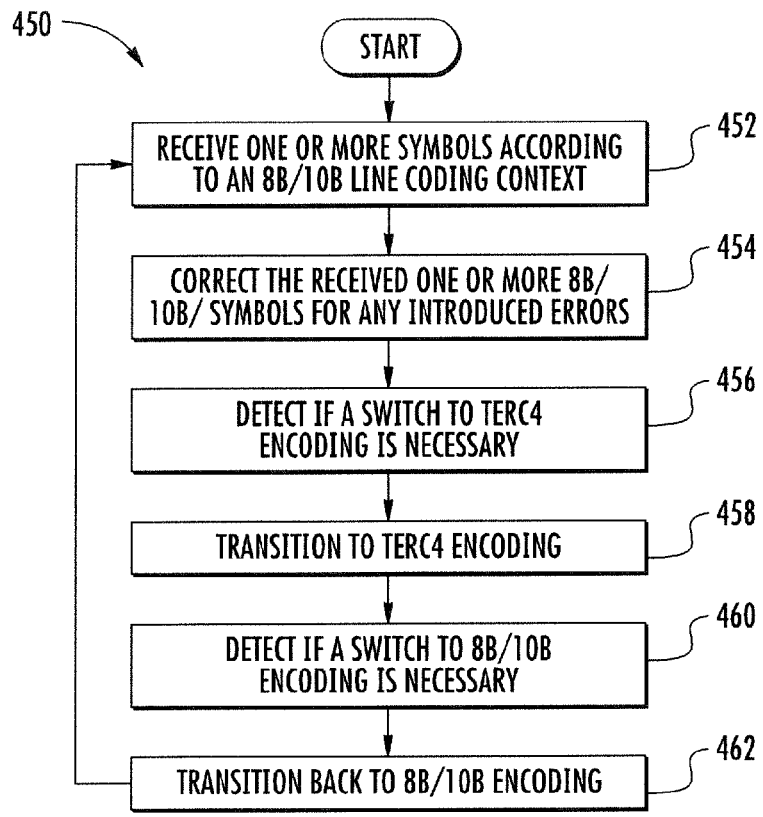
FIG. 4B is a logical flow diagram that illustrates one exemplary method for intelligently switching between 8B/10B line coding and TERC4 line coding schemes in view of the exemplary state machine of FIG. 4A.

Referring now to FIG. 4B, one exemplary method 450 for intelligently switching between 8B/10B line coding and TERC4 line coding schemes based on HDMI data context is disclosed.

At step 452, the receiver receives one or more symbols according to an 8B/10B line coding context. As previously noted, under the 8B/10B scheme the five (5) least significant bits (LSB) of data are encoded into a six (6) bit group (the 5b/6b portion) and the three (3) most significant bits (MSB) are encoded into a 4-bit group (the 3b/4b portion). These code groups are concatenated together to form a 10-bit symbol. For clarity, as used hereinafter, the term "8B/10B" refers to the common usage (i.e., the IBM 8B/10B variant).

One useful property of such an encoding scheme is that since 10-bit symbols are utilized to encode 8-bit words, some of the possible one-thousand twenty-four ($2^{10}$=1024) codes can be excluded in order to comply with the previously mentioned run-length limit of five (5) consecutive equal bits and a differential limit such that the difference of the count of 0s and 1s is no more than two (2) for a given twenty bit string of bits. In addition, some of the two-hundred fifty-six (256) possible 8-bit words can be encoded in two alternative ways. Using these alternative encodings, the scheme is able to affect long-term DC-balance on the transmission line.

This DC-balance is accomplished in part via a mechanism known as "running disparity" that keeps the number of 1s and 0s that are transmitted roughly equal. That is, for each 5b/6b and 3b/4b code with an unequal number of 1s and 0s, there are two (2) bit patterns that can be used to transmit it. For example, a first ten-bit with two more 1s then 0s can be represented as follows: 001011 1110. This first ten-bit pattern can also be represented by its inverse, thereby encoding two more two 0s than 1s as follows: 110100 0001. Accordingly, depending on the current running disparity of the signal, the encoding hardware selects which of the two possible 10-bit sequences to send for the given data.

In addition, 8B/10B encoding possesses what are known as a "special symbols". They are typically referred to in the form "Kx.y" and have different encodings from any of the possible "Dx.y" symbols; i.e., they are symbols that cannot result via the encoding of an 8-bit data symbol. Table 1 below illustrates the format for these special symbols, which include a first 10-bit code for a running disparity of negative one (−1), along with its inverse for a running disparity of positive one (+1):

TABLE 1

8B/10B Special Symbols

| Input - Special Symbols | | RD = −1 | RD = +1 |
|---|---|---|---|
| K-Codes | HGF EDCBA | abcdei fghj | abcdei fghj |
| K.28.0 | 000 11100 | 001111 0100 | 110000 1011 |
| K.28.1 | 001 11100 | 001111 1001 | 110000 0110 |
| K.28.2 | 010 11100 | 001111 0101 | 110000 1010 |
| K.28.3 | 011 11100 | 001111 0011 | 110000 1100 |
| K.28.4 | 100 11100 | 001111 0010 | 110000 1101 |
| K.28.5 | 101 11100 | 001111 1010 | 110000 0101 |
| K.28.6 | 110 11100 | 001111 0110 | 110000 1001 |
| K.28.7 | 111 11100 | 001111 1000 | 110000 0111 |
| K.23.7 | 111 10111 | 111010 1000 | 000101 0111 |
| K.27.7 | 111 11011 | 110110 1000 | 001001 0111 |
| K.29.7 | 111 11101 | 101110 1000 | 010001 0111 |
| K.30.7 | 111 11110 | 011110 1000 | 100001 0111 |

These special symbols are inserted into the data stream and accordingly, can be used for executing low-level control functions separate and apart from encoded data symbols. For example, the DisplayPort specification sets forth a number of control functions that can be mapped onto these so-called "K-codes" of the IBM 8B/10B encoder specification. These control functions include: (1) Blanking Start (BS); (2) Blanking End (BE); (3) Fill Start (FS); (4) Fill End (FE); (5) Secondary-data Start (SS); (6) Secondary-data End (SE); (7) Scrambler Reset (SR); (8) Content Protection BS (CPBS); and (9) Content Protection SR (CPSR).

Referring back to FIG. 4B, at step 454, the receiver applies appropriate robustness in the event that one or more of the received 8B/10B symbols contains an introduced error. In the exemplary embodiment, the receiver exploits the fact that the preamble contains a sequence of eight identical control symbols, and the preamble is followed by a switch to TERC4 coding. In the case of a bit error causing one or more of the 8B10B control symbols to be converted into a different symbol, the receiver can use the fact that it has received several control symbols representing preambles in rapid succession to expect one of the following symbols to be in the TERC4 encoding.

At step 456, the receiver detects if a switch to TERC4 encoding is necessary based on the media parameters and at least one of the received one or more 8B/10B symbols. For example, within HDMI during control periods, control symbols are transmitted repeatedly on the three HDMI main data lanes. HDMI defines four control symbols, representing the four values 0b00, 0b01, 0b10 and 0b11. The value transmitted on lane zero represents whether HSYNC, VSYNC, both or neither is/are being transmitted, and the values transmitted on lanes 1 and 2 are set to non-zero during preambles. Preambles are constructed from eight identical control symbols and are used to signify imminent transitions to data island periods or video data periods. Table 1 illustrates the preambles used for each data period type (i.e., TMDS mode).

TABLE 1

| CTL0 | CTL1 | CTL2 | CTL3 | Data Period Type |
|---|---|---|---|---|
| 1 | 0 | 0 | 0 | Video Data Period |
| 1 | 0 | 1 | 0 | Data Island Period |

Additionally, Table 2 illustrates the control signal-assignment on each of the three main TMDS channels.

TABLE 2

| TMDS Channel (Lane) | D0 | D1 |
|---|---|---|
| 0 | HSYNC | VSYNC |
| 1 | CTL0 | CTL1 |
| 2 | CTL2 | CTL3 |

In this invention these values are allocated to 8B10B control symbols, and thus are readily distinguished from data.

At step 458, when a switch occurs the receiver transitions to TERC4 encoding. Thereafter, the receiver detects when to return to 8B/10B encoding based on the media parameters and at least one of the received one or more TERC4 symbols (step 460). Finally, at step 462, when a switch occurs the receiver transitions back to 8B/10B encoding.

Apparatus

Figure 5:
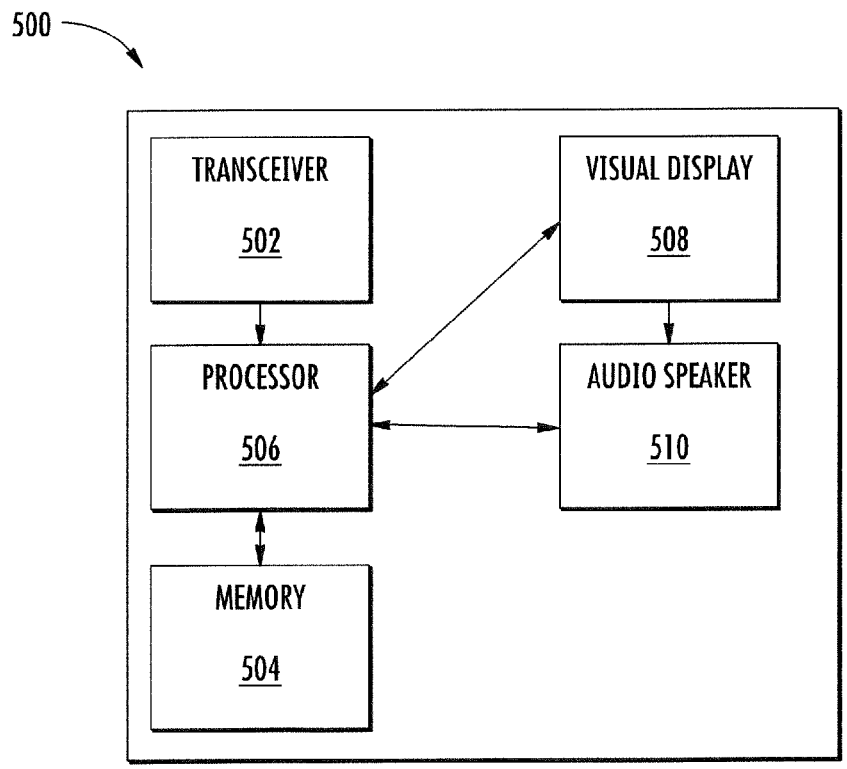
FIG. 5 is a logical block diagram representing an exemplary apparatus configured to intelligently switch between line coding schemes based on context.

Referring now to FIG. 5, an exemplary apparatus 500 configured to intelligently switch between line coding schemes according to a detected context is illustrated. In one embodiment, the apparatus comprises a user device (e.g., personal computers (PCs), such as for example an iMac™, Mac Pro™, Mac Mini™, MacBook™, MacBook Pro™, MacBook Air™, or minicomputers, whether desktop, laptop, or otherwise, or a mobile devices such as handheld computers, PDAs, video cameras, set-top boxes, personal media devices (PMDs), display device (e.g., those compliant with the aforementioned High-Definition Multimedia Interface (HDMI) standard(s)), or any combinations of the foregoing). While a specific device configuration and layout is shown and discussed, it is recognized that many other configurations may be readily implemented by one of ordinary skill given the present disclosure, the apparatus 500 of FIG. 5 being merely illustrative of the broader principles of the disclosure.

The illustrated apparatus 500 of FIG. 5 includes an upstream/downstream plurality of ports and corresponding receiving/transmitting elements (e.g., receiver or transceiver network interfaces) 502. As used herein, the terms "network interface" or "interface" typically refer to any signal, data, or software interface with a component, network or process including, without limitation, those of the HDMI, Digital Visual Interface (DVI), Mobile High-Definition Link (MHL), FireWire (e.g., FW400, FW800, etc.), USB (e.g., USB2, USB 2.0, USB 3.0, wireless USB), DisplayPort, Ethernet (e.g., 10/100, 10/100/1000 (Gigabit Ethernet), 10-Gig-E, etc.), MoCA, Serial ATA (e.g., SATA, e-SATA, SATAII), Ultra-ATA/DMA, Coaxsys (e.g., TVnet™), radio frequency tuner (e.g., in-band or OOB, cable modem, etc.), Wi-Fi™ (e.g., 802.11a,b,g,n, or any draft standards relating thereto), WiMAX (802.16), PAN (802.15), IrDA or other wireless families, including Bluetooth.

The upstream/downstream plurality of ports and corresponding receiving/transmitting elements 502 may comprise one or more channels, and transceiver apparatus (e.g., multiplexing switches, transmission/reception logic, clock recovery circuitry, etc.). The transceiver apparatus monitors and selectively enables and disables an appropriate line coding protocol. In certain embodiments, the transceiver apparatus is adapted to switch between at least two line coding protocols according to the current context. In one such variant, an HDMI transceiver is configured to use 8B/10B encoding for control and video data periods, and TERC4 encoding for data island periods.

The processing subsystem 506 may comprise one or more of central processing units (CPU) or digital processors, such as a microprocessor, digital signal processor, field-programmable gate array, RISC core, or plurality of processing components mounted on one or more substrates. The processing subsystem is coupled to operational memory 504, which may include for example SRAM, FLASH and SDRAM components. As used herein, the term "memory" includes any type of integrated circuit or other storage device adapted for storing digital data including, without limitation, ROM. PROM, EEPROM, DRAM, SDRAM, DDR/2 SDRAM, EDO/FPMS, RLDRAM, SRAM, "flash" memory (e.g., NAND/NOR), and PSRAM. The processing subsystem may also comprise additional co-processors, such as a dedicated graphics accelerator, network processor (NP), or audio/video processor. As shown processing subsystem 506 includes discrete components, however it is understood that in some embodiments they may be consolidated or fashioned in a SoC (system-on-chip) configuration.

The processing subsystem 506 is adapted to receive one or more media streams from an upstream apparatus 502 for processing for media displays such as a video display 508, or audio speakers 510. Processing subsystem 506 may preferentially comprise graphics processors, applications processors, and or audio processors. In "thin clients", the processing subsystem 506 may be significantly reduced in complexity and limited to simple logic, or in extreme cases altogether non-existent.

It will be recognized that while certain aspects of the disclosure are described in terms of a specific sequence of steps of a method, these descriptions are only illustrative of the broader methods of the disclosure, and may be modified as required by the particular application. Certain steps may be rendered unnecessary or optional under certain circumstances. Additionally, certain steps or functionality may be added to the disclosed embodiments, or the order of performance of two or more steps permuted. All such variations are considered to be encompassed within the principles disclosed and claimed herein.

While the above detailed description has shown, described, and pointed out novel features of the disclosure as applied to various embodiments, it will be understood that various omissions, substitutions, and changes in the form and details of the device or process illustrated may be made by those skilled in the art without departing from the principles described herein. The foregoing description is of the best mode presently contemplated of carrying out the described principles. This description is in no way meant to be limiting, but rather should be taken as illustrative of the general principles described herein. The scope of the disclosure should be determined with reference to the claims.

What is claimed is:

1. A method for intelligently switching between line coding schemes based on context, comprising:
   receiving one or more symbols according to a first context, at a receiving apparatus, the first context characterized by a first line coding scheme;
   detecting, by the receiving apparatus, when a context switch to a second context will occur based on one or more media parameters; and
   when the context switch occurs, changing, by the receiving apparatus, to the second context.

2. The method of claim 1, wherein the context switch occurs when preamble symbol is received during a blanking interval configured in accordance with the one or more media parameters.

3. The method of claim 1, wherein the first context is associated with a first state, and the second context is associated with a second state.

4. The method of claim 3, wherein the first context comprises an 8B/10B line coding context and the first state is an active video state or blanking state.

5. The method of claim 3, wherein the second context comprises a TMDS (Transition Minimized Differential Signaling) Error Reduction Coding 4-bit (TERC4) line coding context and the second state is a data island state.

6. The method of claim 3, wherein transitioning between the first state and the second state is based at least in part on receiving a preamble during a blanking interval, where the blanking interval is determined from the one or more media parameters.

7. The method of claim 1, wherein a blanking interval is determined at least in part by the one or more media parameters.

8. The method of claim 7, wherein the one or more media parameters additionally includes at least one or more of a fixed number of scan lines and a length of each scan line.

9. An apparatus configured to intelligently switch between line coding schemes based on context, comprising:
   a first interface configured to receive one or more symbols according to at least one of: (i) a first context, the first context characterized by a first line coding scheme, and (ii) a second context, the second context characterized by a second line coding scheme;
   a processor coupled to the first interface; and
   a non-transitory computer-readable medium comprising one or more instructions which when executed by the processor, cause the apparatus to:
      detect when the context switch will occur based on one or more media parameters and a current state of a state machine; and
      when a context switch occurs, change context.

10. The apparatus of claim 9, wherein the state machine comprises an active video state, a blanking state, and a data island state.

11. The apparatus of claim 10, wherein the state machine is configured to transition between the active video state and the blanking state based on one or more preamble symbols.

12. The apparatus of claim 10, wherein the blanking state is based on the one or more media parameters.

13. The apparatus of claim 10, wherein the one or more media parameters comprise one or more attributes selected from the group consisting of: a display size, a frame rate, and a blanking interval length.

14. The apparatus of claim 10, wherein the context switch occurs when a preamble symbol is received during a blanking interval configured in accordance with the one or more media parameters.

15. An apparatus configured to intelligently switch between line coding schemes based on context, comprising:
   a sink configured to receive one or more symbols according to at least one of: (i) a first context, the first context characterized by a first line coding scheme, and (ii) a second context, the second context characterized by a second line coding scheme;
   a source configured to transmit the one or more symbols according to the first and second contexts;

a display element;

a processor; and a non-transitory computer-readable medium comprising one or more instructions which when executed by the processor, cause the apparatus to:

determine when a context switch should occur based on one or more media parameters and a current state of a state machine; and when a context switch occurs, cause the source to change the context.

16. The apparatus of claim 15, wherein the one or more media parameters are associated with a media file stored within the non-transitory computer-readable medium.

17. The apparatus of claim 16, wherein the one or more media parameters are based at least in part on a display size, a frame rate, and a blanking interval length associated with the display element.

18. The apparatus of claim 15, wherein the first context comprises an 8B/10B line coding context and the first state is an active video state or blanking state.

19. The apparatus of claim 15, wherein the second context comprises a TMDS (Transition Minimized Differential Signaling) Error Reduction Coding 4-bit (TERC4) line coding context and the second state is a data island state.

* * * * *